(12) United States Patent
Lu et al.

(10) Patent No.: US 12,193,166 B2
(45) Date of Patent: Jan. 7, 2025

(54) PRINTED CIRCUIT BOARD HAVING A SACRIFICIAL PAD TO MITIGATE GALVANIC CORROSION

(71) Applicant: Western Digital Technologies, Inc., San Jose, CA (US)

(72) Inventors: Songtao Lu, Shanghai (CN); Hsiang Ju Huang, Taichung (TW); Binbin Zheng, Shanghai (CN); Cheng-Hsiung Yang, Taiwan (TW); Chien-Te Chen, Taichung (TW)

(73) Assignee: Sandisk Technologies, Inc., Milpitas, CA (US)

( * ) Notice: Subject to any disclaimer, the term of this patent is extended or adjusted under 35 U.S.C. 154(b) by 354 days.

(21) Appl. No.: 17/719,815

(22) Filed: Apr. 13, 2022

(65) Prior Publication Data

US 2023/0337372 A1   Oct. 19, 2023

(51) Int. Cl.
*H05K 3/28* (2006.01)
*H05K 1/09* (2006.01)

(52) U.S. Cl.
CPC .............. *H05K 3/282* (2013.01); *H05K 1/09* (2013.01); *H05K 2203/0591* (2013.01)

(58) Field of Classification Search
CPC ............... H05K 1/09; H05K 1/117; H05K 2201/09781; H05K 2201/10159; H05K 2203/0591; H05K 3/0005; H05K 3/26; H05K 3/282
See application file for complete search history.

(56) References Cited

U.S. PATENT DOCUMENTS

| | | | | |
|---|---|---|---|---|
| 4,055,725 A | * | 10/1977 | Boynton | H05K 3/305 361/748 |
| 10,349,533 B1 | * | 7/2019 | Liu | H05K 1/115 |
| 11,234,327 B1 | * | 1/2022 | Lu | H05K 3/244 |
| 2001/0023532 A1 | * | 9/2001 | Fujii | H01L 21/4857 29/830 |
| 2003/0172526 A1 | * | 9/2003 | Komatsubara | H05K 3/108 29/831 |
| 2006/0145343 A1 | * | 7/2006 | Lee | H01L 23/49816 257/737 |
| 2008/0173470 A1 | * | 7/2008 | Barbetta | H05K 3/282 174/257 |
| 2008/0268267 A1 | * | 10/2008 | Barbetta | H05K 3/244 428/458 |
| 2009/0133902 A1 | * | 5/2009 | Kim | H05K 1/111 174/250 |

(Continued)

*Primary Examiner* — William H. Mayo, III
*Assistant Examiner* — Rhadames Alonzo Miller
(74) *Attorney, Agent, or Firm* — Armstrong Teasdale LLP

(57) ABSTRACT

In one example, the present application describes a Printed Circuit Board (PCB) that mitigates galvanic corrosion during an Organic Solderability Preservative (OSP) process used during fabrication of the PCB. The PCB includes a first metal pattern and a second metal pattern electrically coupled to each other, where the first and second metal patterns are different metals. The first metal pattern has a first area that is exposed by a solder mask layer, and the second metal pattern has a second area that is exposed by the solder mask area. A ratio of the first area to the second area is less than a threshold ratio to mitigate the galvanic corrosion of the second metal pattern exposed on the PCB during the OSP process.

13 Claims, 5 Drawing Sheets

(56) References Cited

U.S. PATENT DOCUMENTS

| | | | | |
|---|---|---|---|---|
| 2009/0243087 A1* | 10/2009 | Nakamura | ............ | H01L 23/585 |
| | | | | 257/737 |
| 2009/0244878 A1* | 10/2009 | Wurzel | ................ | H05K 9/0024 |
| | | | | 361/818 |
| 2010/0193225 A1* | 8/2010 | Abe | ...................... | H05K 3/4641 |
| | | | | 216/13 |
| 2012/0033395 A1* | 2/2012 | Ishii | ..................... | H05K 3/0097 |
| | | | | 29/829 |
| 2012/0250275 A1* | 10/2012 | Yamamoto | .............. | H01L 24/83 |
| | | | | 29/829 |
| 2014/0069694 A1* | 3/2014 | Cho | ..................... | H05K 3/3452 |
| | | | | 174/251 |
| 2014/0166098 A1* | 6/2014 | Kian | ....................... | H01L 31/18 |
| | | | | 438/98 |
| 2014/0202743 A1* | 7/2014 | Kim | ....................... | H05K 1/028 |
| | | | | 174/254 |
| 2016/0005683 A1* | 1/2016 | Liu | ......................... | H05K 3/244 |
| | | | | 174/257 |
| 2019/0074125 A1* | 3/2019 | Yoshioka | .............. | H01F 27/292 |
| 2020/0266149 A1* | 8/2020 | Xu | .......................... | H01L 21/56 |
| 2021/0206154 A1* | 7/2021 | Liu | ....................... | G06F 1/1637 |
| 2023/0092954 A1* | 3/2023 | Leitgeb | .................. | H01L 24/10 |
| | | | | 257/774 |
| 2023/0328873 A1* | 10/2023 | Hui Chen | ............ | H05K 1/0218 |

\* cited by examiner

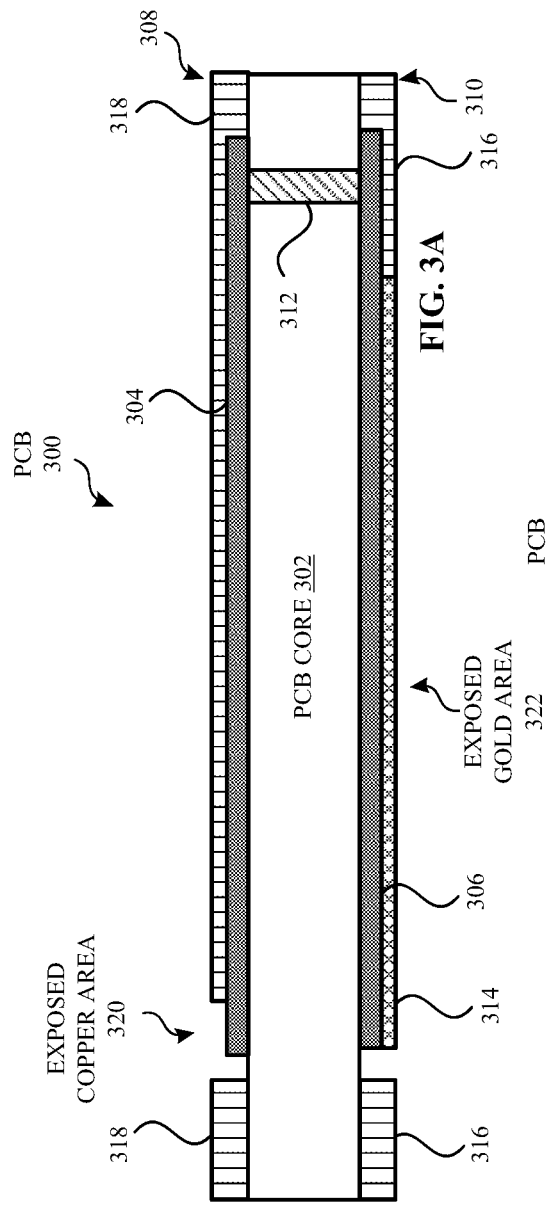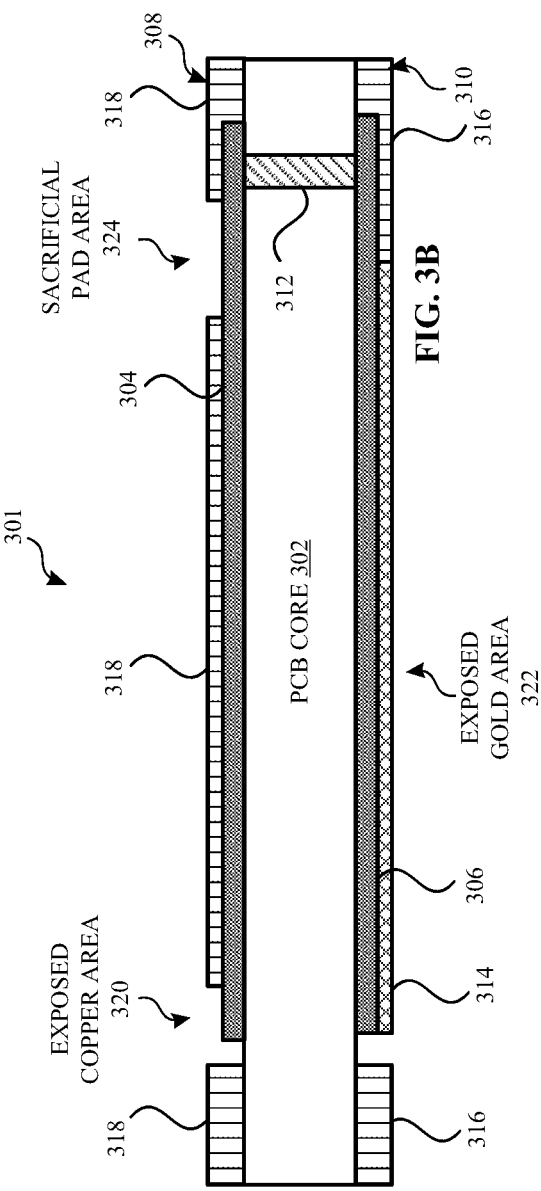

*MODIFY DESIGN* →

PRINTED CIRCUIT BOARD HAVING A SACRIFICIAL PAD TO MITIGATE GALVANIC CORROSION

BACKGROUND

An Organic Solderability Preservative (OSP) process may be applied to a Printed Circuit Board (PCB) to prevent the bare copper on the PCB from oxidizing prior to component placement on the PCB. The OSP process uses water-based organic compound(s) that selectively bond to copper and form an organic film on the bare copper, which subsequently does not interfere with components being soldered to the bare copper. However, a PCB may include gold features (e.g., hard gold contacts and/or soft gold bonding pads) that are electrically coupled to copper traces on the PCB. During the OSP process, soft etching is performed on the PCB to prepare the bare copper for the OSP. During soft etching, galvanic corrosion between the gold features and the copper traces can over-etch the copper traces, resulting in breaks in the copper traces. Accordingly, it would be advantageous to mitigate galvanic corrosion associated with the OSP process when a PCB utilizes gold features electrically coupled to copper traces.

SUMMARY

Organic Solderability Preservative (OSP) is a surface protection technique used to protect bare copper on a Printed Circuit Board (PCB) from oxidizing prior to component placement. Typically, soft etching is performed prior to OSP in order to clean and prepare the bare copper for OSP. When a PCB includes both gold patterns and copper patterns electrically coupled together, galvanic corrosion generated during soft etching can damage or destroy the copper patterns, which may render the PCB inoperable.

Accordingly, the present application describes a PCB that mitigates galvanic corrosion during an OSP process used during fabrication of the PCB. The PCB includes a first metal pattern and a second metal pattern electrically coupled to each other, where the first and second metal patterns are different metals. The first metal pattern has a first area that is exposed by a solder mask layer, and the second metal pattern has a second area that is exposed by the solder mask area. A ratio of the first area to the second area is less than a threshold ratio to mitigate the galvanic corrosion of the second metal pattern exposed on the PCB during the OSP process.

Also described is a PCB that mitigates galvanic corrosion of the PCB during an OSP process. The PCB includes an electrode having an anode and a cathode. The cathode has a first area that is exposed by a solder mask layer, and the anode has a second area that is exposed by the solder mask layer. The ratio of the first area to the second area is less than a threshold area, and the second area is increased to mitigate the galvanic corrosion of the anode exposed on the PCB during the OSP process based on determining that the ratio is greater than the threshold ratio.

The present application also describes a method of fabricating a PCB to mitigate galvanic corrosion of the PCB during an OSP process. The method includes identifying a first metal pattern on the PCB electrically coupled to a second metal pattern, where the first metal pattern and the second metal pattern are different metals. The method further includes calculating a first area of the first metal pattern that is exposed by a solder mask layer of the PCB, and determining if a ratio of the first area to the second area is greater than a threshold ratio. The method further includes, based on determining that the ratio of the first area to the second area is greater than the threshold ratio, increasing the second area to mitigate the galvanic corrosion of the second metal pattern exposed on the PCB during the OSP process.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

FIGS. 3A and 3B illustrate modifications to a PCB to mitigate galvanic corrosion during an OSP process according to an example.

DETAILED DESCRIPTION

Figure 1B:
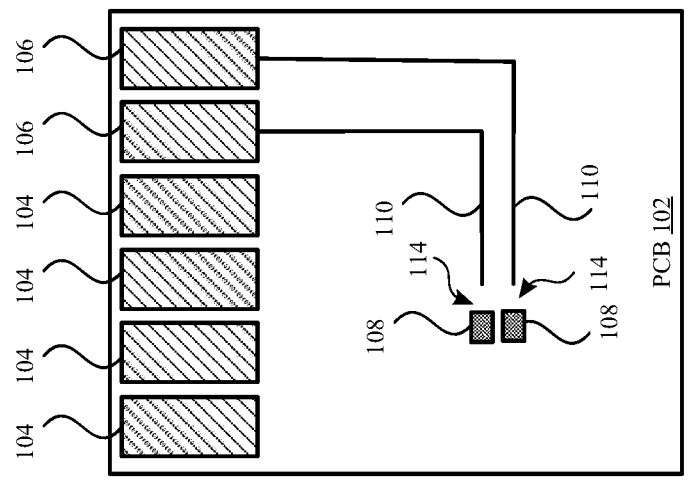
FIGS. 1A and 1B illustrate a known PCB subjected to an OSP process that results in galvanic corrosion.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. Examples may be practiced as methods, systems or devices. Accordingly, examples may take the form of a hardware implementation, an entirely software implementation, or an implementation combining software and hardware aspects. The following detailed description is therefore not to be taken in a limiting sense, and the scope of the present disclosure is defined by the appended claims and their equivalents.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As briefly described above, OSP is surface protection technology for PCBs intended to prevent oxidation of exposed copper on the PCBs prior to component placement. OSP provides protection using selective absorption of organic compounds such as benzotriazole imidazole and benzimidazole by the exposed copper. In some PCBs, some exposed copper patterns on the PCB are electrically coupled with gold patterns. For example, contacts or fingers on the PCB can utilize a hard gold plating to form a wear-resistant surface. Hard gold plating is a gold electrodeposit that has been alloyed with one or more other elements to alter the grain structure of the gold and to achieve a harder deposit with a more refined grain structure. Common alloying elements used in hard gold plating include cobalt, nickel, or iron. Soft gold plating is sometimes used on the PCB for electrical contacts (e.g., wire bonding from a die to the PCB). Soft gold plating is a high purity gold electrodeposit that is typically pure gold without the addition of any alloying elements. Soft gold plating produces a coarser grain structure that is generally free of any significant co-deposits.

In order to achieve successful absorption between the organic compounds used during the OSP process and the exposed copper on the PCB, a soft etching solution is used to perform micro-etching on the exposed copper (e.g., using $H_2SO_4$ and $H_2O_2$), which removes contaminants from the surface of the exposed copper and prepares the surface for the OSP organic film. The etching rate during soft etching is typically calculated based on the etching rate of copper. However, for copper patterns electrically coupled to gold patterns, over-etching can occur due to galvanic corrosion between copper and gold while the PCB is in the soft etching solution. Often, high density PCBs utilize fine pitch copper traces, which may be rapidly destroyed during soft etching due to over-etching. The damage resulting from this type of galvanic corrosion may lead to broken copper traces and subsequently, the failure of the copper traces to reliably carry electrical signals across the PCB.

Galvanic corrosion is an electrochemical process in which one metal corrodes preferentially when it is in electrical contact with another type of metal in the presence of an electrolyte. In the OSP process, the soft etching solution is the electrolyte, gold is one type of metal, and copper is another type of metal. During soft etching, copper patterns electrically coupled with gold patterns on the PCB that contact the soft etching solution corrode preferentially, which over-etches the copper patterns.

Dissimilar metals and alloys have different electrode potentials (E). When copper and gold (or alloys of gold) come into contact with the soft etching solution, copper forms an anode of an electrode and gold forms a cathode of the electrode, with the soft etching solution forming the electrolyte for the electrode. An electro potential difference between the reaction at the anode (copper) and the reaction at the cathode (gold or gold alloy) is the driving force that generates galvanic corrosion of the copper patterns.

Although the types of dissimilar metals that form the electrode are one factor in galvanic corrosion, another factor is the relative surface area of each of the copper patterns and the gold patterns exposed to the soft etching solution. Gold contacts or gold fingers on a PCB, which are typically hard gold due to wear considerations, may have a significantly larger surface area exposed to the soft etching solution than the copper traces electrically coupled to the gold contacts or gold fingers. For example, copper traces may be mostly covered by a solder mask on the PCB, which further increases the Au/Cu area ratio for the electrode. If the area of the cathode (gold or gold alloy patterns) exposed to the soft etching solution is large and the area of the anode (copper traces) exposed to the soft etching solution is small, then a current produced between the cathode and the anode due to their electro potential differences may be large, resulting in the copper traces corroding relatively quickly as compared to other copper traces on the PCB that are not electrically coupled to gold or gold alloy patterns.

In order to address problems associated with galvanic corrosion of a gold-copper pattern on a PCB, the present application describes modifications to a PCB to reduce the likelihood that galvanic corrosion will damage copper traces on the PCB that are coupled to gold patterns, such as gold fingers. As will be explained in more detail below, one modification to the PCB includes exposing additional copper area on a gold-copper pattern by removing a portion of a solder mask for the copper area, which reduces the Au/Cu area ratio and therefore, the corrosion rate of the copper portion of the gold-copper pattern in the PCB. Another modification to the PCB includes adding an additional copper pattern to the gold-copper pattern on the PCB, which also reduces the Au/Cu area ratio and therefore, the corrosion rate of the copper portion of the gold-copper pattern.

Figure 1A:
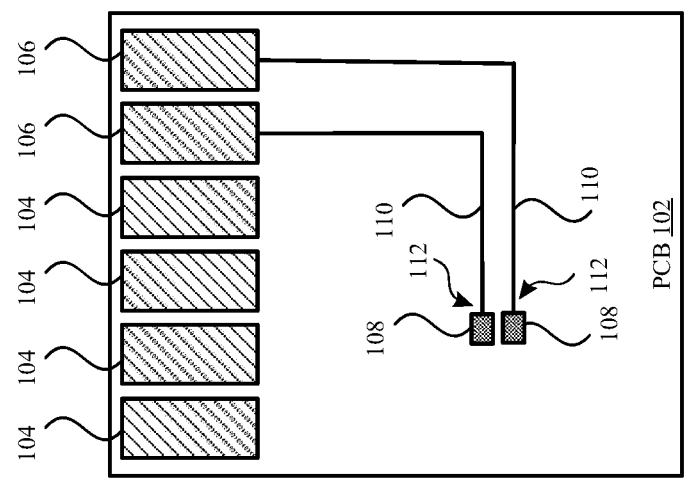

FIGS. 1A and 1B illustrate a known PCB 102 subjected to the OSP process that results in galvanic corrosion. FIG. 1A depicts a PCB 102, which may be used as a substrate for a memory card. PCB 102 includes gold fingers 104, 106, which may use alloys of gold (e.g., gold and nickel) to form a hard wear-resistance surface. Gold fingers 104, 106 may be used, for example, to removably couple PCB 102 to a memory card reader after components are installed onto PCB 102.

In FIG. 1A, gold fingers 106 are coupled to pads 108 via copper traces 110. Pads 108 may, for example, be copper pads or lands used for mounting components to PCB 102 in a subsequent assembly process. Portions of PCB 102 typically include a solder mask (not shown) which is applied to PCB 102 in a pattern to protect copper traces 110 on PCB 102. The solder mask is patterned on PCB 102 to avoid regions on PCB 102 that will either include components (e.g., pads 108) and electrical contacts (e.g., gold fingers 104, 106). However, the solder mask may not completely cover copper traces 110 in all cases. For example, regions 112 proximate to pads 108 may not be covered by solder mask, either due to registration issues in applying the solder mask to PCB 102 or due to design considerations. One design consideration that may result in solder mask being removed around pads 108, thereby exposing copper traces 110 is when flip chip interconnect is used to electrically connect components to PCB 102. Flip chip, which may also be referred to as controlled collapse chip connection (C4), is a method of interconnecting semiconductor dies to a PCB using solder bumps that have been deposited on the chip electrical contact pads. The solder bumps are deposited on the chip pads on a top side of the wafer during a final wafer processing step. In order to mount the chip to PCB 102, the chip is flipped such that the solder bumps on the top side of the die contact pads 108 on PCB 102. However, the area around the die and pads 108 has solder mask removed in order to ensure spacing around the die for placement on PCB 102, because a solder mask layer under the die would result in a space between the die and pads 108 (e.g., pads 108 are lower in height on PCB 102 than the solder mask layer). Therefore, removing the solder mask layer around pads 108 for C4 placement of the die exposes copper traces 110 in regions 112 to the OSP process.

After PCB 102 is fabricated but before final component placement, OSP may be applied to PCB 102 to prevent pads 108 from oxidizing before installing components onto PCB 102. Prior to OSP, soft etching is performed (e.g., using a solution of $H_2SO_4$ and $H_2O_2$) to prepare and clean the exposed copper areas of PCB 102 (e.g., pads 108). During soft etching, gold fingers 106, copper traces 110 exposed to the soft etching solution at regions 112, and pads 108 form an electrode, as described previously. Copper is more reactive than gold, and in addition, the areas of copper exposed to the soft etching solution (e.g., pads 108) and the exposed portions of copper traces 110 in regions 112 are relatively small as compared to the areas of gold fingers 106. As a result, galvanic corrosion can occur in copper traces 110 in regions 112 where copper traces 110 are exposed to the solution, which may then be over-etched as depicted in FIG. 1B, causing breaks 114 in copper traces 110. The result of breaks 114 in copper traces 110 in PCB 102 of FIG. 1B is that signals are not reliably routed from gold fingers 106 to pads 108.

Figure 2:
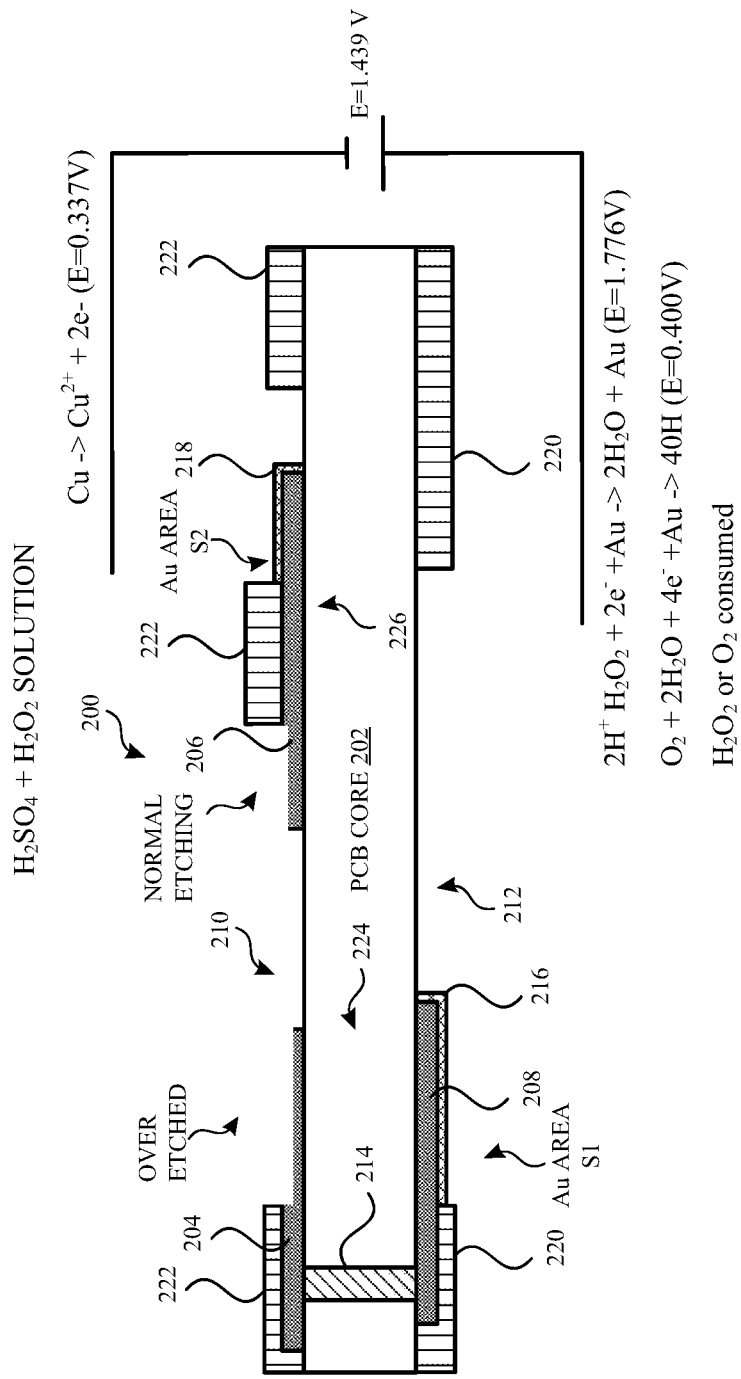
FIG. 2 illustrates a known galvanic cell forming mechanism for a PCB.

FIG. 2 illustrates a known galvanic cell forming mechanism for a PCB 200, when PCB 200 is subjected to a soft etching solution of $H_2SO_4+H_2O_2$ prior to OSP. In FIG. 2, PCB 200 includes a PCB core 202, which is typically formed from a fiberglass-epoxy laminate (e.g., FR4). PCB 200 includes areas of copper traces 204, 206, 208 patterned on both sides 210, 212 of PCB 200, with copper traces 204, 208 electrically coupled together across PCB core 202 using a via 214. Copper trace 208 on side 212 of PCB 200 is coupled to a gold finger 216, and copper trace 206 of side 210 of PCB 200 is coupled to a gold pad 218. Gold finger 216 may be used, for example, as a contact for PCB 200, while gold pad 218, for example, may be used to wire bond a die (not shown) to PCB 200 when assembling components on PCB 200. PCB 200 further includes solder masks 222, 220 patterned on both sides 210, 212, which are used to protect some areas of copper traces 204, 206, 208 and/or PCB core 202.

During soft etching of PCB 200, two electrodes 224, 226 are formed on PCB 200, each having a potential of 1.439 volts. A first electrode 224 has an anode formed from copper traces 204, 208 and a cathode formed from gold finger 216. A second electrode 226 has an anode formed from copper trace 206 and a cathode formed from gold pad 218. During soft etching, copper trace 204 is over-etched while copper trace 206 is etched normally, due to the differences in Au area S1 for gold finger 216 as compared to the Au area S2 for gold pad 218. In FIG. 2, Au area S1 is larger than Au area S2, which increases the rate of etching at copper trace 204 as compared to the rate of etching at copper trace 206 due to galvanic corrosion.

FIGS. 3A and 3B illustrate modifications to a PCB 300 to mitigate galvanic corrosion of a PCB during an OSP process according to an example. PCB 300 includes a PCB core 302, which is typically formed from a fiberglass-epoxy laminate (e.g., FR4). PCB 300 includes areas of copper traces 304, 306 patterned on both sides 308, 310 of PCB 300, with copper traces 304, 306 electrically coupled together across PCB core 302 using a via 312. Copper trace 306 on side 310 of PCB 300 is coupled to a gold finger 314. Gold finger 314 may be used, for example, as a contact for PCB 300. PCB 300 further includes solder mask 318 patterned on side 308, and solder mask 316 patterned on side 310, which are used to protect some areas of copper traces 304, 306 and/or PCB core 302. In the example of FIG. 3A, copper trace 304 includes a copper area 320 exposed by solder mask 318. Gold finger 314 has a gold area 322 exposed by solder mask 316. Generally, PCB 300 includes copper area 320 and gold area 322 that are exposed to the electrolytic soft etching solution during the OSP process, which generates an electrode, with the anode of the electrode being copper traces 304, 306 and the cathode of the electrode being gold finger 314. As discussed previously, the Au/Cu area ratio is a factor in the etching rate of copper in a copper-gold electrode. In FIG. 3A, the Au/Cu area ratio generated by gold area 322 and copper area 320 may be, for example 300:1, which would result in a high etch rate for copper trace 304 at copper area 320 if PCB 300 were subjected to soft etching during the OSP process.

In order to mitigate the effects of galvanic corrosion for PCBs during the OSP process, the Au/Cu area ratio is reduced, for example, to 30:1 or less by modifying PCB 300 to include a sacrificial pad area 324, as depicted for PCB 301 in FIG. 3B. Reducing the Au/Cu area ratio to 30:1 or less significantly reduces the corrosion rate of the copper traces in the copper-gold patterns on a PCB during the OSP process, as compared, for example, to a higher Au/Cu area ratio of 100:1 or even 300:1 that would often be found on a typical PCB.

Sacrificial pad area 324 reduces the Au/Cu area ratio by exposing more copper area on copper trace 304 during soft etching. In the example of FIG. 3B, the Au/Cu area ratio is reduced based on the combined Cu area generated by copper area 320 and sacrificial pad area 324, which reduces the overall Au/Cu area ratio during soft etching. The result is reduced etching overall at copper trace 304, which prevents damage to copper trace 304. In the example, sacrificial pad area 324 is generated by modifying solder mask 318 applied to copper trace 304, although in other examples, sacrificial pad area 324 may be generated using a separate copper trace or copper pattern (not shown but described in more detail below in FIGS. 4A, 4B) that is electrically coupled to copper trace 304 and gold finger 314, and further, is exposed to the soft etching solution during the OSP process. Generally, sacrificial pad area 324 may be formed from any copper area in PCB 301 that is both electrically coupled with gold finger 314 and exposed to the soft etching solution.

In some examples, PCB 300 is modified to reduce the Au/Cu area ratio below a threshold ratio by removing a portion of solder mask over an existing copper structure on an outer layer of PCB 300 (e.g., copper trace 304) in order to generate sacrificial pad area 324. In other examples, PCB 300 is modified to reduce the Au/Cu area ratio below a threshold ratio by adding additional copper features on one or more outer layers of PCB 301 and exposing those additional copper features to soft etching after fabrication by defining a relief in the solder mask for the additional copper features. Generally, sacrificial pad area 324 is a separate and distinct area that would not subsequently be populated with components. Therefore, Au/Cu area ratio modification in a PCB may be determined by examining the PCB for copper features on the outer surfaces of the PCB that are devoid of both components and solder mask, especially if the copper features appear intended only to reduce the overall ratio of the Au area to the Cu area for an electrode generated during soft etching on the PCB.

In addition, although only one sacrificial pad area 324 is illustrated in PCB 301, any number of sacrificial pad areas 324 may be added to PCB 301 in order to reduce the Au/Cu area ratio to a threshold ratio in order mitigate the effects of galvanic corrosion. For instance, PCB 300 may be modified to include any number of smaller Cu areas exposable to soft etching during the OSP process in order to reduce the Au/Cu area ratio in PCB 301 below a threshold ratio. The use of multiple smaller exposed Cu areas rather than few larger exposed Cu areas may be utilized when spacing or design constraints on PCB 301 preclude the use of fewer, larger, Cu exposed areas.

Figure 4B:
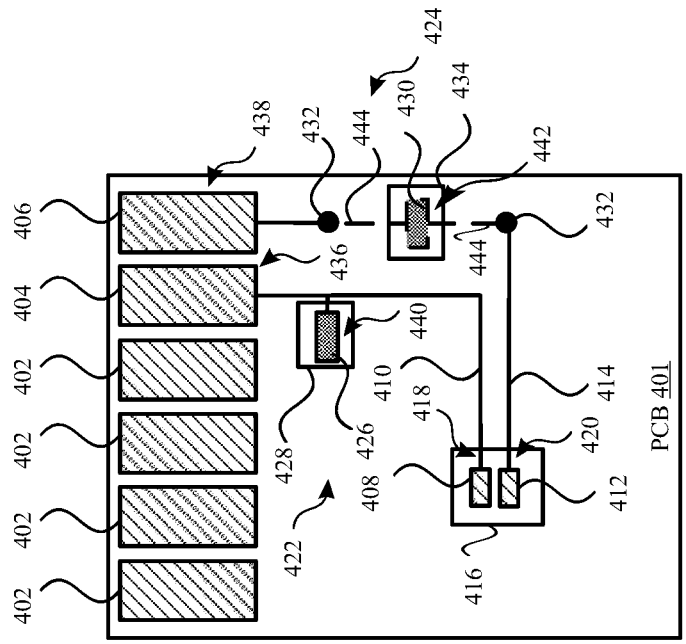
FIGS. 4A and 4B illustrate modifications to another PCB to mitigate galvanic corrosion during an OSP process according to an example.
Figure 4A:
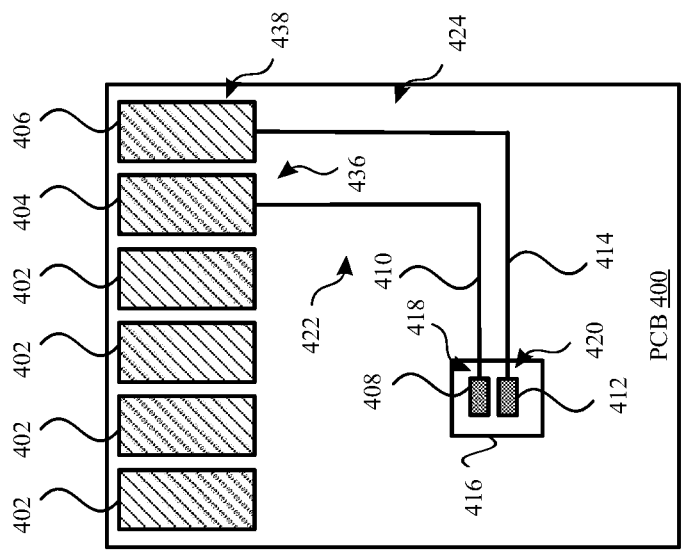

FIGS. 4A and 4B illustrate modifications to a PCB 400 to mitigate galvanic corrosion of a PCB during an OSP process according to an example. FIG. 4A depicts PCB 400, which defines a substrate for a memory card. PCB 400 includes gold fingers 402, 404, 406 which may use alloys of gold (e.g., gold and nickel) to form a hard wear-resistance surface.

In the design depicted in FIG. 4A, gold finger 404 is coupled to a copper pad 408 via a copper trace 410, and gold finger 406 is coupled to a copper pad 412 via a copper trace 414. Copper pads 408, 412 may, for example, be used for mounting a flip chip to PCB 400. PCB 400 includes a solder mask relief 416, which defines an area on PCB 400 that is devoid of solder mask. The result of solder mask relief 416 is that copper areas 418, 420 proximate to copper pads 408 are not covered by solder mask, which may result in breaks in copper traces 410, 414 when PCB 400 undergoes soft etching prior to OSP. In PCB 400, two potential electrodes 422, 424 are shown, if PCB 400 were subjected to soft etching prior to OSP. A first potential electrode 422 is formed from gold finger 404, copper trace 410, and copper pad 408, and a gold area 436 of first potential electrode 422 is the area of gold finger 404. Copper area 418 for first potential electrode 422 is the area of copper pad 408 and the area of copper trace 410 exposed by solder mask relief 416. Thus, the ratio of the Au/Cu areas are large for first potential electrode 422. In some cases, the Au/Cu area ratio may be as high as 300:1. A second potential electrode 424 is formed from gold finger 406, copper trace 414, and copper pad 412, and a gold area 438 of second potential electrode 424 is the area of gold finger 406. Copper area 420 for second potential electrode 424 is the area of copper pad 412 and the area of copper trace 414 exposed by solder mask relief 416. Thus, the ratio of the Au/Cu areas are also large for second potential electrode 424.

In order mitigate possible galvanic corrosion issues, PCB 400 is modified as depicted in FIG. 4B (PCB 401) to reduce the Au/Cu area ratio for two potential electrodes 422, 424 in PCB 400. For first potential electrode 422, a sacrificial pad 426 (a copper pattern) is electrically coupled to copper trace 410, and a solder mask relief 428 is added to PCB 401 around sacrificial pad 426. Solder mask relief 428 ensures that sacrificial pad 426 is exposed to soft etching prior to OSP. Further, sacrificial pad 426 adds an additional copper area 440 to first potential electrode 422, which reduces the overall Au/Cu area ratio for first potential electrode 422. For second potential electrode 424, a sacrificial pad 430 (a copper pattern) is electrically coupled to copper trace 414 using vias 432 and additional copper traces 444, and a solder mask relief 434 is added to PCB 401 around sacrificial pad 430. Solder mask relief 434 ensures that sacrificial pad 430 is exposed to soft etching prior to OSP. Further, sacrificial pad 430 adds an additional copper area 442 to second potential electrode 424, which reduces the overall Au/Cu area ratio for second potential electrode 424. The use of vias 432 in this example allows sacrificial pad 430 to be placed on the opposite side of PCB 401, which may be desirable based on design considerations.

Figure 5:
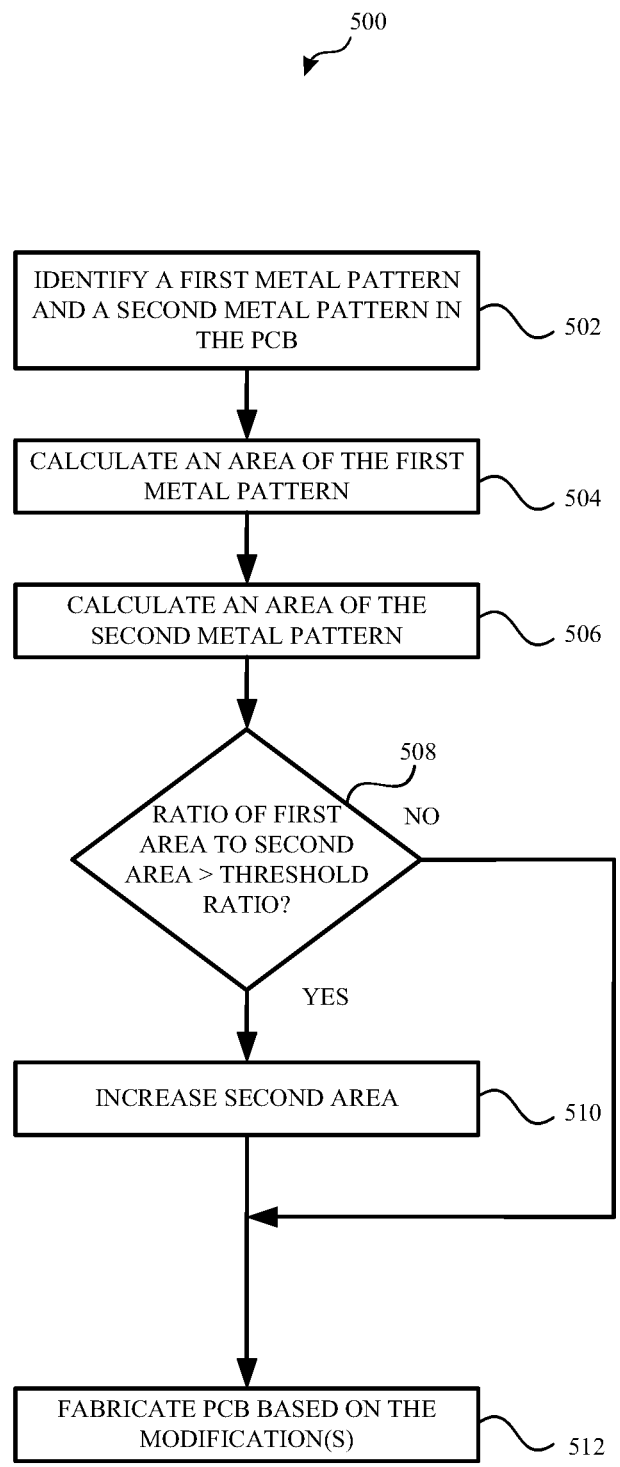
FIG. 5 illustrates a method of fabricating a PCB to mitigate galvanic corrosion of the PCB during an OSP process according to an example.

FIG. 5 illustrates a method 500 of fabricating a PCB to mitigate galvanic corrosion of the PCB during the OSP process according to an example. The operations of method 500 are not all inclusive and method 500 may include other operations, not shown. Further, the operations of method 500 may be performed in a different order. Method 500 may be used to fabricate a PCB such as, for example, PCBs 301, 401 depicted in FIGS. 3B, 4B, respectively.

Method 500 begins by identifying a first metal pattern of the PCB electrically coupled to a second metal pattern, where the first metal pattern and the second metal pattern comprise different metals (see operation 502). For example, the first metal pattern may comprise gold, and the second metal pattern may comprise copper. Method 500 continues by calculating a first area of the first metal pattern that is exposed by a solder mask layer of the PCB (see operation 504). For instance, a PCB may be analyzed to calculate an area of a gold finger on the PCB that is coupled to an exposed copper trace. Method 500 continues by calculating a second area of the second metal pattern that is exposed by the solder mask layer on the PCB (see operation 506). For instance, the PCB may be analyzed to calculate an exposed area of the copper trace that is coupled to the gold finger. Method 500 continues by determining if a ratio of the first area to the second area is greater than a threshold ratio (see operation 508). For example, method 500 may determine if the ratio of gold area in the metal pattern to the copper area in the metal pattern under analysis is greater than or equal to about 30:1. If the ratio is less than about 30:1, then the potential for galvanic corrosion during soft etching prior to OSP may be low, and modification of the PCB may not be needed. However, if the ratio is greater than about 30:1, for example, if the ratio is 100:1 or greater, then the potential for galvanic corrosion during soft etching prior to OSP may be high, and modification of the PCB may be warranted. In response to determining that the ratio is greater than the threshold ratio, the PCB is modified to increase the Cu area to mitigate the galvanic corrosion of the second metal pattern (e.g., copper traces) exposed on the PCB during the OSP process (see operation 510). Increasing the Cu area may be performed, for example, by removing a portion of a solder mask layer from the second metal pattern. In another example, increasing the Cu area may be performed by adding an additional second metal pattern to the PCB, and removing a portion of the solder mask layer from the additional second metal pattern. In response to increasing the Cu are a on the PCB, method 500 continues by fabricating the PCB based on the modifications (see operation 512).

The method and systems described herein describe various mechanisms to both identify the possibility of galvanic corrosion for a PCB, and to mitigate the undesirable effects of galvanic corrosion a PCB, thereby providing technical benefits in the art.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A Printed Circuit Board (PCB) that mitigates galvanic corrosion during an Organic Solderability Preservative (OSP) process used during fabrication of the PCB, comprising:
    a first metal pattern and a second metal pattern electrically coupled to each other, wherein the first metal pattern and the second metal pattern comprise different metals;
    wherein the first metal pattern has a first area that is exposed by a solder mask layer;
    wherein the second metal pattern has a second area that is exposed by the solder mask layer; and
    wherein a ratio of the first area to the second area is less than a threshold ratio to mitigate the galvanic corrosion of the second metal pattern exposed on the PCB during the OSP process.

2. The PCB of claim 1, wherein at least a portion of the solder mask layer is removed from the second metal pattern to increase the second area, thereby reducing the ratio of the first area to the second area.

3. The PCB of claim 1, further comprising:
    an additional second metal pattern electrically coupled to the first metal pattern, wherein at least a portion of the solder mask layer is removed from the additional second metal pattern.

4. The PCB of claim 1, wherein the first metal pattern comprises at least one of gold and an alloy of gold.

5. The PCB of claim 1, wherein the second metal pattern comprises copper.

6. The PCB of claim 1, wherein:
    the first metal pattern comprises one or more gold fingers; and
    the second metal pattern comprises one or more copper traces.

7. The PCB of claim 1, wherein the ratio is at least 30:1.

8. A Printed Circuit Board (PCB) that mitigates galvanic corrosion of the PCB during an Organic Solderability Preservative (OSP) process, the PCB comprising:
    an electrode including an anode and a cathode;
    wherein the cathode has a first area that is exposed by a solder mask layer;
    wherein the anode has a second area that is exposed by the solder mask layer;
    wherein a ratio of the first area to the second area is less than a threshold ratio; and
    wherein the second area is increased to mitigate the galvanic corrosion of the anode exposed on the PCB during the OSP process based on determining that the ratio is greater than the threshold ratio.

9. The PCB of claim 8, wherein the electrode comprises dissimilar metals electrically coupled together.

10. The PCB of claim 9, wherein the dissimilar metals comprise copper and at least one of gold and alloys of gold.

11. The PCB of claim 9, wherein a portion of the solder mask layer is removed from the anode to increase the second area.

12. The PCB of claim 9, further comprising:
    an additional anode; and
    wherein a portion of the solder mask layer is removed from the additional anode to adjust the ratio.

13. The PCB of claim 9, wherein the ratio is at least 30:1.

* * * * *